United States Patent
Ansari et al.

(10) Patent No.: US 9,160,362 B1
(45) Date of Patent: Oct. 13, 2015

(54) LEMPEL-ZIV (LZ)-BASED DATA COMPRESSION EMPLOYING IMPLICIT VARIABLE-LENGTH DISTANCE CODING

(71) Applicant: QUALCOMM Incorporated, San Diego, CA (US)

(72) Inventors: Amin Ansari, San Diego, CA (US); Vito Remo Bica, Poway, CA (US); Rodolfo Giacomo Beraha, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/272,929

(22) Filed: May 8, 2014

(51) Int. Cl.
H03M 7/30 (2006.01)

(52) U.S. Cl.
CPC .................................. H03M 7/3088 (2013.01)

(58) Field of Classification Search
CPC ..................... H03M 13/2909; H03M 13/2948; G06T 9/005
USPC ...................... 341/67, 65, 50, 106, 51, 59, 63
See application file for complete search history.

(56) References Cited

U.S. PATENT DOCUMENTS

| | | | |
|---|---|---|---|
| 6,903,668 B1 * | 6/2005 | Dror et al. ........................ 341/67 |
| 7,724,974 B2 | 5/2010 | Koziarz | |
| 7,751,634 B2 | 7/2010 | Venkataraman | |
| 8,335,385 B2 | 12/2012 | Strom et al. | |
| 8,456,331 B2 | 6/2013 | Carlson | |
| 8,493,381 B1 | 7/2013 | Touma et al. | |
| 8,610,606 B2 * | 12/2013 | Glass et al. ...................... 341/67 |
| 8,704,686 B1 * | 4/2014 | Agarwal et al. ................. 341/51 |
| 8,791,843 B2 * | 7/2014 | Cohen .............................. 341/51 |
| 8,793,655 B2 * | 7/2014 | Petrov et al. .................. 717/122 |
| 2009/0060047 A1 | 3/2009 | Schneider | |

OTHER PUBLICATIONS

Deutsch, P., "RFC 1951—Deflate Compressed Data Format Specification version 1.3," Aladdin Enterprises, May 1996, 13 pages, http://www.faqs.org/rics/rfc1951.html.
International Search Report and Written Opinion for PCT/US2015/025512, mailed Jul. 24, 2015, 10 pages.

* cited by examiner

*Primary Examiner* — Peguy Jean Pierre
(74) *Attorney, Agent, or Firm* — Withrow & Terranova, PLLC

(57) ABSTRACT

Lempel-Ziv (LZ)-based data compression employing implicit variable-length distance coding is disclosed. Distances in LZ-based data compression length and distance blocks are implicit variable-length encoded during data compression to avoid padding encoded distances with extra bits (e.g., trailing 0's) that require fewer bits for storage than the number of bits needed to store maximum distance length. This reduces distance bit lengths in compressed output data to further reduce data size. During data compression, a distance table is generated that contains entries each having an assigned base and a number of extra bits to be read in compressed data during data decompression. In this manner, during data decompression, the entries in the distance table can be consulted to determine the number of bits in the variable-encoded distance in the compressed data to be read since the encoded distances can be encoded in the compressed data in fewer bits and without bit padding.

30 Claims, 13 Drawing Sheets

| DISTANCE ENTRY (20) | BASE (24) | EXTRA BITS TO BE READ (26) |
|---|---|---|
| ENTRY-0 | $0 (0 \times 000)$ | $10_{10} (N-2)$ |
| ENTRY-1 | $1024_{10} (0 \times 400)$ | $9_{10} (N-3)$ |
| ENTRY-2 | $1536_{10} (0 \times 600)$ | $9_{10} (N-3)$ |
| ENTRY-3 | $2048_{10} (0 \times 800)$ | $11_{10} (N-1)$ |

| DISTANCE WIDTH (28) | DISTANCE RANGE (22) |
|---|---|
| $2^{N-2}-1$ : | $0-1023_{10} (0 \times 000 - 0 \times 3FF)$ |
| $2^{N-3}-1$ : | $1024_{10}-1535_{10} (0 \times 400 - 0 \times 5FF)$ |
| $2^{N-3}-1$ : | $1536_{10}-2047_{10} (0 \times 600 - 0 \times 7FF)$ |
| $2^{N-1}-1$ : | $2048_{10}-4095_{10} (0 \times 800 - 0 \times FFF)$ |

| DISTANCE ENTRY (20) | BASE (24) | MULTIPLES (96) | EXTRA BITS TO BE READ (26) |
|---|---|---|---|
| ENTRY-0 | 0 (0 x 000) | 1 | 12 (0 x 0) (N-0) |
| ENTRY-1 | 0 (0 x 000) | 4 | 8 (0 x 8) (N-4) |
| ENTRY-2 | 1024 (0 x 400) | 4 | 8 (0 x 8) (N-4) |
| ENTRY-3 | 2048 (0 x 800) | 4 | 9 (0 x 9) (N-3) |

| DISTANCE WIDTH (28) | DISTANCE VALUE RANGE (22) |
|---|---|
| $2^{N-0}$ | 0 - 4095 (0 x 000 - 0 x FFF) |
| $2^{N-4}$ | 0 - 1023 (0 x 000 - 0 x 3FF) |
| $2^{N-4}$ | 1024 - 2047 (0 x 400 - 0 x 7FF) |
| $2^{N-3}$ | 2048 - 4095 (0 x 800 - 0 x FFF) |

LEMPEL-ZIV (LZ)-BASED DATA COMPRESSION EMPLOYING IMPLICIT VARIABLE-LENGTH DISTANCE CODING

BACKGROUND

I. Field of the Disclosure

The technology of the disclosure relates generally to data compression techniques, and more particularly to Lempel-Ziv (LZ)-based data compression techniques.

II. Background

Data compression is used in processor-based systems to reduce data size. Reducing data size can reduce memory needed to store a given amount of data. Reducing memory size can thus also lower the area needed for memory circuits in an integrated circuit and lower costs of the integrated circuit as a result. Reducing memory size can also reduce static energy by reducing on-chip retention power needed to retain data in memory. Data compression can also reduce the amount of data transfer bandwidth needed for reading data from and writing data to memory, thus increasing performance and reducing dynamic energy expended in transferring data.

One technique used to compress data is Lempel-Ziv (LV)-based compression. LZ-based compression is a lossless data compression technique. FIG. 1 illustrates an example of an input data block 10 before compression, and after being compressed into an output data block 12 using an LZ-based compression technique. As shown in FIG. 1, the LZ-based compression captures a repeated data pattern 14R (e.g., AABC) of data 14 in the input data block 10 to be compressed. The captured repeated data pattern 14R in the input data block 10 is reduced to a reduced size length and distance block 16 (e.g., [4, 12]) from the current point that the repeated data pattern 14R appeared elsewhere in the input data block 10. In this manner, when the output data block 12 is decompressed, the length and distance block 16 can be replaced with the true pattern (e.g., AABC) at the distance and length in the output data block 12 to recreate the uncompressed input data block 10.

Huffman coding can be applied on top of LZ-based compression to achieve improved compression ratio. In Huffman coding, the length and distance blocks in an LZ-based compression output data block can be reduced in size by replacing the length and distance blocks with a specific prefix code that is not otherwise used in the original data to reduce the encoding of distances. Data patterns that are more frequently repeated are assigned the smallest prefix codes, with less repeated data patterns being assigned larger prefix codes, and so on, to reduce the size of the prefix codes coded in the output data. For example, a Huffman prefix code may be a value from '1' that can be stored in 1-bit to a very large number (e.g., 4096) that requires multiple bits to be stored. In Huffman coding, a Huffman tree is generated from the exact frequencies of distance for length and distance blocks in the compressed data to store the correlated assigned prefix codes used in encoding the distances. The Huffman tree may be large in size if the number of unique distances present in the LZ-based length and distance blocks is large. Thus, when decompressing data that was compressed and Huffman-coded, the Huffman tree is consulted to decode the prefix codes encoded in the length and distance blocks back to distances to provide the original LZ-based length and distance blocks. The LZ-based length and distance blocks are then decoded during decompression to recreate the original compressed data in the output data.

While Huffman coding can result in further reduction in data size of LZ-based compressed data, Huffman coding can be costly in terms of power consumption and latency. Additional latency is involved in assigning and storing prefix codes for length and distance blocks during data compression in the Huffman tree, and retrieving length and distance blocks from prefix codes from the Huffman tree during data decompression.

SUMMARY OF THE DISCLOSURE

Aspects disclosed herein include Lempel-Ziv (LZ)-based data compression employing implicit variable-length distance coding. Related devices, systems, methods, and computer-readable media are also disclosed. LZ-based compression is employed to replace repeated data patterns with length and distance blocks to reduce data size. Instead of employing Huffman coding to further reduce the size of the length and distance blocks in LZ-based compression coding, the distances in the length and distance blocks are implicit variable bit-length ("variable-length") encoded during data compression. Variable-length distance encoding involves not using trailing 0's to pad encoded distances that require fewer bits for storage than the number of bits needed to store the maximum distance length, so as to reduce distance size in compressed output data. For example, if the maximum distance value in an LZ-based data compression is 4095 (0xFFF), thus requiring 12-bits for storage, a distance value of 1023 (0x3FF) only requires 10-bits of storage without using trailing 0's for reduced encoded distance size in compressed data. But, since the length of variable-length coded distances is not fixed, a technique must be provided for determining the number of bits to read in the variable-coded distance in the compressed data for decompression.

In this regard, in order to determine the number of bits to be read in a variable-coded distance for decompression, a distance table is generated during data compression to provide implicit variable-length distance coding. The distance table is organized such that variable-length encoded distances assigned to a common base value (e.g., $2^N$, where N is the number of bits needed for storage without use of trailing 0's) are associated with any entry in the distance table. Each entry in the distance table indicates the number of extra bits to be read in the compressed data, taking into consideration the common base value assigned to the entry. For example, an entry in the distance table corresponding to a base of 1024 (i.e., 0x400) can indicate that only ten (10) bits need to be read for encoded distances between 1024-2047 (0x400-0x7FF). In this example, the entry in the distance table allows ten (10) bits to be used to store encoded distances between 1024-2047 (i.e., common base of 1024+10 bits for offset) in compressed data, instead of twelve (12) bits if the maximum distance were 4095 (i.e., "0xFFF").

In this manner, the entry in the distance table can be consulted during decompression, so that the correct number of bits in the variable-encoded distance in the compressed data are read for decompression. This allows encoded distances requiring fewer bits for storage than the number of bits required for the maximum encoded distance, to be stored in fewer bits in the compressed data, and without the need to use padded trailing 0's, for further data size reduction. Reduced data size is achieved over using LZ compression coding alone while still allowing the distance values to be stored in the compressed data. Further, the distance table employed in the implicit variable-length distance coding can be configured with fewer entries, thus requiring less memory and less latency for storing prefix codes during data compression and accessing stored prefix codes during data decompression.

In this regard in one aspect, an implicit variable-length distance coding circuit is provided. The implicit variable-length distance coding circuit comprises an implicit variable-length distance encoder. The implicit variable-length distance encoder is configured to receive a pre-processed data block comprising a plurality of distance values for repeated data patterns in an uncompressed data block. The implicit variable-length distance encoder is also configured to generate an implicit variable-length distance encoded data block of the pre-processed data block. The implicit variable-length distance encoder is also configured to generate the implicit variable-length distance encoded data block, by, for each of the plurality of distance values in the pre-processed data block, being configured to lookup a distance entry in a distance table comprising an implicit distance value range corresponding to the distance value, the distance entry comprising a base value corresponding to the implicit distance value range and a number of extra bits to be read corresponding to the implicit distance value range, and encode the distance value with the least significant bits in the distance value corresponding to the extra bits to be read in distance entry in the distance table corresponding to the distance value, to generate an encoded distance value.

In another aspect, an implicit variable-length distance coding circuit is provided. The implicit variable-length distance coding circuit comprises a means for receiving a pre-processed data block comprising a plurality of distance values for repeated data patterns in an uncompressed data block. The implicit variable-length distance coding circuit also comprises a means for generating an implicit variable-length distance encoded data block of the pre-processed data block.

In another aspect, a method for compressing data is provided. The method comprises receiving a pre-processed data block comprising a plurality of distance values for repeated data patterns in an uncompressed data block. The method also comprises generating an implicit variable-length distance encoded data block of the pre-processed data block. The implicit variable-length distance encoded data block of the pre-processed data block is generated by, for each of the plurality of distance values in the pre-processed data block, looking up a distance entry in a distance table comprising an implicit distance value range corresponding to the distance value, the distance entry comprising a base value corresponding to the implicit distance value range and a number of extra bits to be read corresponding to the implicit distance value range, and encoding the distance value with the least significant bits in the distance value corresponding to the extra bits to be read in distance entry in the distance table corresponding to the distance value, to generate an encoded distance value.

In another aspect, a non-transitory computer-readable medium is provided. The non-transitory computer-readable medium has stored thereon computer executable instructions to cause a processor-based implicit variable-length distance coding circuit to implicit variable-length distance encode data, by receiving a pre-processed data block comprising a plurality of distance values for repeated data patterns in an uncompressed data block, and generating an implicit variable-length distance encoded data block of the pre-processed data block by, for each of the plurality of distance values in the pre-processed data block: looking up a distance entry in a distance table comprising an implicit distance value range corresponding to the distance value, the distance entry comprising a base value corresponding to the implicit distance value range and a number of extra bits to be read corresponding to the implicit distance value range, and encoding the distance value with the least significant bits in the distance value corresponding to the extra bits to be read in distance entry in the distance table corresponding to the distance value, to generate an encoded distance value.

BRIEF DESCRIPTION OF THE FIGURES

FIG. 2 is an exemplary distance table divided into even distributions of distances over a maximum distance value range to provide implicit variable-length distance coding of distances in encoded LZ-based length and distance blocks in compressed data to reduce distance bit lengths;

FIG. 8 is another exemplary distance table that can be generated by an implicit variable-length distance coding circuit in FIG. 3 based on distribution of distance value ranges determined in encoded LZ-based length and distance blocks in LZ-based compressed data.

DETAILED DESCRIPTION

Figure 1:
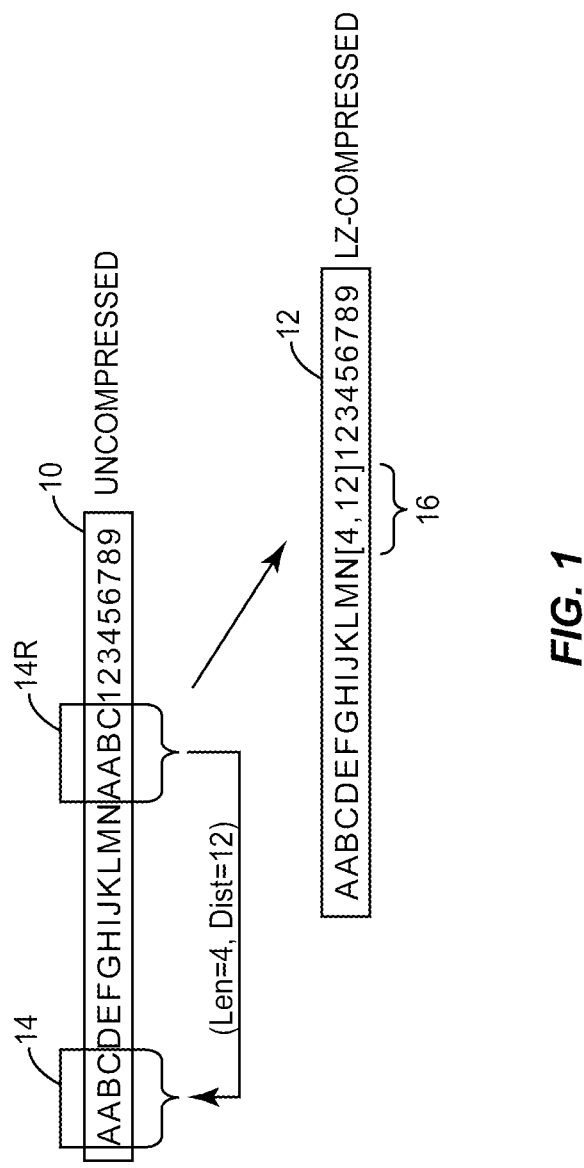
FIG. 1 illustrates an exemplary uncompressed data block and after being compressed using Lempel-Ziv (LZ)-based data compression.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed herein include Lempel-Ziv (LZ)-based data compression employing implicit variable-length distance coding. Related devices, systems, methods, and computer-readable media are also disclosed. LZ-based compression is employed to replace repeated data patterns with length and distance blocks to reduce data size. Instead of employing Huffman coding to further reduce the size of the length and distance blocks in LZ-based compression coding, the distances in the length and distance blocks are implicit variable bit-length ("variable-length") encoded during data compression. Variable-length distance encoding involves not using trailing 0's to pad encoded distances that require fewer bits for storage than the number of bits needed to store the maximum distance length, so as to reduce distance size in compressed output data. For example, if the maximum distance value in an LZ-based data compression is 4095 (0xFFF), thus requiring 12-bits for storage, a distance value of 1023 (0x3FF) only requires 10-bits of storage without using trailing 0's for reduced encoded distance size in compressed data. But, since the length of variable-length coded distances is not fixed, a technique must be provided for determining the number of bits to read in the variable-coded distance in the compressed data for decompression.

Figure 3:
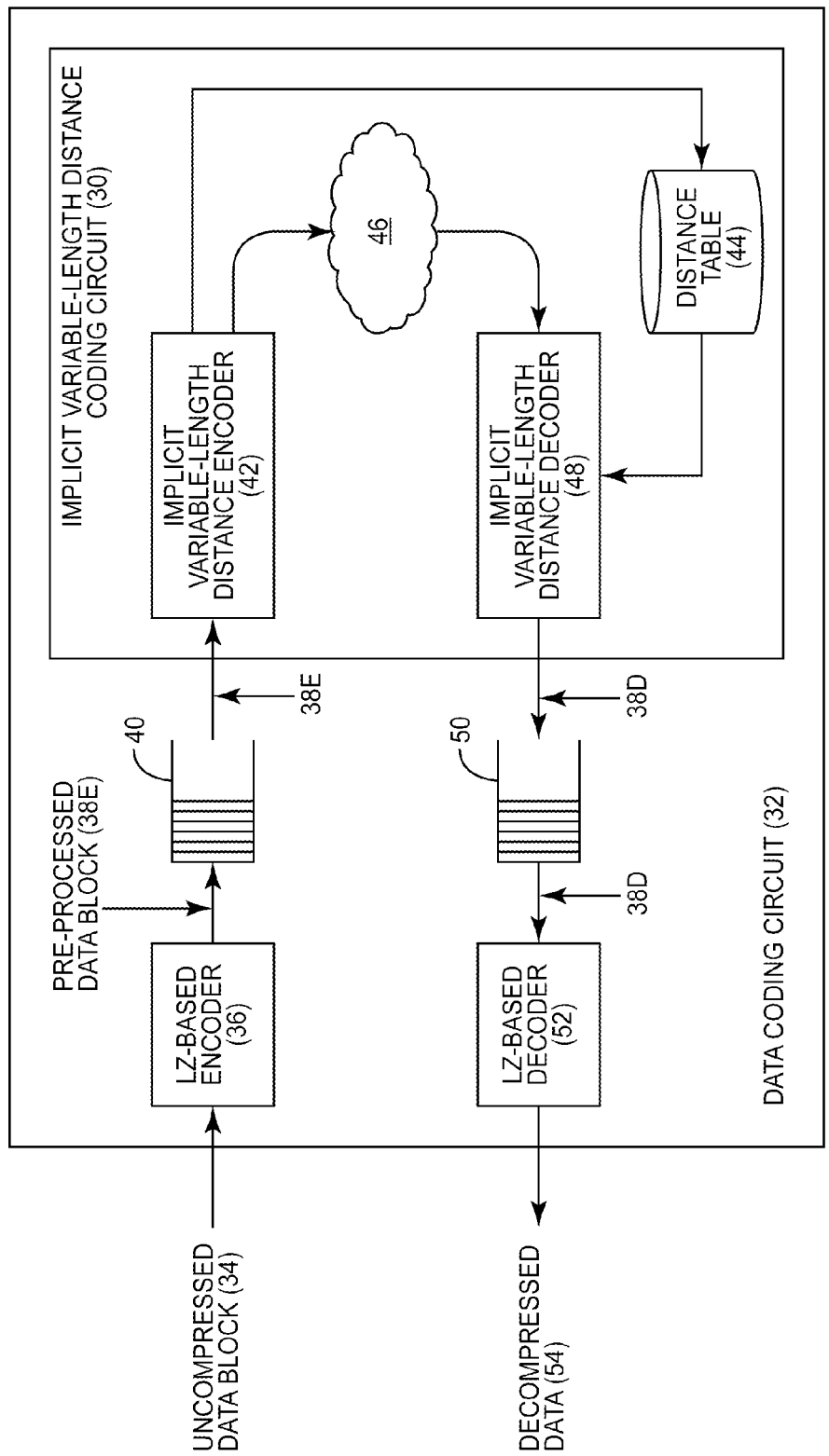
FIG. 3 is a block diagram of an exemplary LZ-based data compression circuit employing implicit variable-length distance encoding to reduce encoded distance sizes in LZ-based length and distance blocks in compressed data.

Before discussing the devices and methods for providing implicit variable-length distance coding of LZ-based compressed data starting at FIG. 3, the concepts of implicit variable-length distance coding are first described with regard to FIG. 2. In this regard, FIG. 2 illustrates an exemplary distance table 18 that can be generated during encoding for implicit variable-length distance coding of fixed-length distances in length and distance blocks in LZ-based compressed data to further reduce bit lengths of encoded distance values. The distance table 18 can then be consulted during decoding for implicit variable-length distance decoding of variable-length distances in length and distance blocks.

As illustrated in FIG. 2, the distance table 18 contains a distance entry column 20 containing four (4) distance entries labeled "Entry-0"-"Entry 3" in this example. Each distance entry Entry-0-Entry-3 is associated with a distance value range, shown in a distance value range column 22, based on a maximum distance value contained in length and distance blocks of format [L, D] in an LZ-based preprocessed data block. For example, the maximum distance value encoded in the length and distance blocks of the LZ-based compressed data employing the distance table 18 in FIG. 2 is $4096_{10}$ (0xFFF), as shown by the upper distance value in the distance value range for Entry-3 in FIG. 2. This means that distances values in the length and distance blocks of the LZ-based compressed data, before implicit variable-length distance encoding, are encoded as fixed-length twelve (12$_0$ bit numbers in the format as [L, $D_{11}$-$D_0$] to allow the maximum distance value of $4095_{10}$ to be encoded (e.g., [L, $4095_{10}$] encoded as [L, $1111111111111_2$]).

However, not all distance values in length and distance blocks are large enough to need twelve ($12_{10}$) bits for encoding. For example, distance values between $1024_{10}$ (0x400) and $2047_{10}$ (0x7FF) only require eleven (11) bits to encode. Distance values between $512_{10}$ (0x200) and $1023_{10}$ (0x3FF) only require ten (10) bits to encode. But without variable-length distance encoding, these lower distance values are still encoded in LZ-based compressed data as twelve ($12_{10}$)-bit numbers in this example, but with padded trailing 0's. Thus, if the distance values can be further variable-length encoded in the LZ-based compressed data, further bit size reductions can be achieved in the length and distance blocks for further compression. However, when the length and distance blocks are decoded, it will not be known how many bits are to be read for the distance values since the distance values would be stored as variable-length distances. If the number of bits to be read is encoded as extra bits in the length and distance blocks, the reduction in distance bit length encoding may be outweighed by the extra bits added to the length and distance blocks.

In this regard, as illustrated in the example of FIG. 2, the entries Entry-0-Entry-3 in the distance table 18 are each associated with a particular distance value range with the range of distance values contained in length and distance blocks of LZ-based compressed data. This allows for implicit encoding of the number of bits to be read in variable-length encoded distance values in length and distance blocks of LZ-based compressed data. In this example, the distance value range represented in the distance table 18 is $0$-$4095_{10}$. A base column 24 and an extra bits to be read column 26 are associated with each distance value range represented by Entry-0-Entry-3 in the distance table 18. For example, distance Entry-1 is associated with distance value range $1024_{10}$ (0x400)-$1535_{10}$ (0x5FF) and base $1024_{10}$ (0x400) in this example. Thus, when decoding a variable-length distance value of $1533_{10}$ (0x5FD) in a length and distance block as an example, Entry-1 in the distance table 18 is consulted, because $1533_{10}$ is within the distance value range $1024_{10}$-$1535_{10}$. Entry-1 indicates a base of $1024_{10}$ with nine ($9_{10}$) bits indicated as the number of extra bits to be read to obtain the variable-length distance value in the length and distance block, because $1533_{10}$ can be represented as a base of $1024_{10}$ (0x400) plus an offset of $509_{10}$ (i.e., $1533_{10}$-$1024_{10}$). The offset of $509_{10}$, which is 0x1FD, can be represented in nine ($9_{10}$) least significant bits of $1533_{10}$. Thus, the distance value of $509_{10}$ can be encoded in nine ($9_{10}$) bits in a length and distance block for the distance value of $1533_{10}$ if the distance value can be associated with Entry-1 in the distance table 18, as opposed to encoding in twelve ($12_{10}$) bits.

With continuing reference to FIG. 2, the extra bits to be read in the distance table 18 for a given distance entry is equal to the exponential term of the distance width, shown in a distance width column 28, plus '1' covered by the distance entry. For example, for Entry-1, the distance value range is $1535_{10}$-$1024_{10}$=$511_{10}$=$2^{N-3}$-1, where N=$12_{10}$. Thus, the number of extra bits to be read for Entry-1 is N-3, which is nine ($9_{10}$) (i.e., $12_{10}$-$3_{10}$).

Even though this distance value of $1533_{10}$ using the distance table 18 in the example of FIG. 2 above can be encoded in a length and distance block in nine ($9_{10}$) bits instead of twelve ($12_{10}$), the distance entry in which to consult in the distance table 18 must also be encoded. Otherwise, it will not be known what base and extra bits to be read should be used to decode a variable-length distance value using the implicit variable-length distance technique described above. In this regard, the length and distance block can be encoded according to the following format [L, $T_1$-$T_0$, D], as shown in FIG. 2, where $T_1$-$T_0$ is the distance entry to be consulted in the distance table 18 (i.e., $T_1$-$T_0$ can encode up to four ($4_{10}$) distance entries). Even with the extra two ($2_{10}$) bits to encode the distance entry in the length and distance block, for distances values between $1024_{10}$-$1533_{10}$, a bit is saved (i.e., twelve ($12_{10}$) distance value encoding vs. nine ($9_{10}$) bit offset and two ($2_{10}$) bits distance entry encoding). Likewise, distances values between $1536_{10}$-$2047_{10}$ also save a bit in encoded distance values. However, distance values between $2048_{10}$-$4095_{10}$ would not save bits in encoded distance values because of eleven ($11_{10}$) bit offset and two ($2_{10}$) bits distance entry encoding versus twelve ($12_{10}$) distance value encoding. Thus, as discussed in more detail below, it may be desired to select distance value ranges for distance entries in the distance table 18 that reflect the frequency of distance values in the length and distance blocks in LZ-based compressed data that are further implicit variable-length distance encoded, rather than all distance entries spanning the same number of distance values (i.e., distance value width).

However, even if the four ($4_{10}$) distance entries in the distance table 18 in FIG. 2 had unique distance value ranges spanning equal distance widths (i.e., $0$-$1023_{10}$, $1024_{10}$-$2047_{10}$, $2048_{10}$-$3071_{10}$, $3072_{10}$-$4095_{10}$, the number of extra bits to be read were ten ($10_{10}$) along with a two ($2_{10}$) bit distance entry encoding would be the same bits as fixed-length distance value encoding of twelve ($12_{10}$) bits. Regardless, even this configuration of the distance table 18 in FIG. 2 may be advantageous. In this scenario, the distance table 18 could be configured to be much smaller than, for example, a Huffman tree, where an entry is required in the Huffman tree for every unique distance value in the length and distance blocks of LZ-based compressed data, as opposed to only requiring distance entries for distance value ranges.

FIG. 3 is a block diagram of an exemplary implicit variable-length distance coding circuit 30 that can be provided as part of a data coding circuit 32. As will be described below, the implicit variable-length distance coding circuit 30 is configured to replace fixed-length distance values in LZ-based length and distance blocks with implicit variable-length distance encoded distance values to achieve a further data compression according to the principles discussed above with regard to the exemplary distance table 18 in FIG. 2. By "data" compression, it is meant that any data can be compressed by the data coding circuit 32, including without limitation computer-executable instructions in a program store and a data in data store.

As shown in FIG. 3, the data coding circuit 32 is configured to receive an uncompressed data block 34 to be data-compressed during an encoding process. The uncompressed data block 34 is received by an LZ-based encoder 36 in this example. The LZ-based encoder 36 is configured to identify repeated data patterns in the uncompressed data block 34. The LZ-based encoder 36 is also configured to replace identified repeated data patterns with length and distance blocks, as shown in FIG. 1 for example, to compress the uncompressed data block 34 into an LZ-based encoded pre-processed data block 38E (hereinafter "pre-processed data block 38E"). The pre-processed data block 38E may then be stored in an encoding queue 40 to be readied for implicit variable-length distance encoding to achieve further data compression. As will be discussed in more detail below with regard to FIG. 4A, the pre-processed data block 38E is then provided to an implicit variable-length distance encoder 42 in the implicit variable-length distance coding circuit 30 to identify fixed-length distance values in length and distance blocks in the pre-processed data block 38E and build a distance table 44 with distance entries covering distance value ranges of the distance values in the pre-processed data block 38E. The implicit variable-length distance encoder 42 then encodes the fixed-length distance values in the pre-processed data block 38E with variable-length distance values based on the implicit coding provided in the distance table 44 to generate an implicit variable-length distance encoded data block 46 that may be further compressed over the data compression provided in the pre-processed data block 38E.

With continuing reference to FIG. 3, the implicit variable-length distance coding circuit 30 also includes an implicit variable-length distance decoder 48. As will be discussed in more detail below with regard to FIG. 4B, the implicit variable-length distance decoder 48 is configured to receive the implicit variable-length distance encoded data block 46 when it is desired for the implicit variable-length distance decoder 48 to be decoded. In this regard, the implicit variable-length distance decoder 48 decodes the length and distance blocks in the implicit variable-length distance encoded data block 46 by consulting the distance table 44 that was generated by the implicit variable-length distance encoder 42 during encoding, and which corresponds to the implicit variable-length distance encoded data block 46. The implicit variable-length distance decoder 48 replaces the variable-length distance values encoded in the length and distance blocks of the implicit variable-length distance encoded data block 46 into fixed-length distance values, as provided by the LZ-based encoder 36 during encoding, to generate LZ-based decoded pre-processed data 38D. The implicit variable-length distance decoder 48 can store the decoded pre-processed data 38D in a decoding queue 50, if desired. The decoded pre-processed data 38D can be provided to an LZ-based decoder 52, which can decompress the length and distance blocks encoded therein into the full repeated data patterns to provide decompressed data 54. If the implicit variable-length distance decoder 48 decodes the entire implicit variable-length distance encoded data block 46 generated by the implicit variable-length distance encoder 42, the decompressed data 54 will contain the same data block as the uncompressed data block 34 in this example.

Figure 4A:
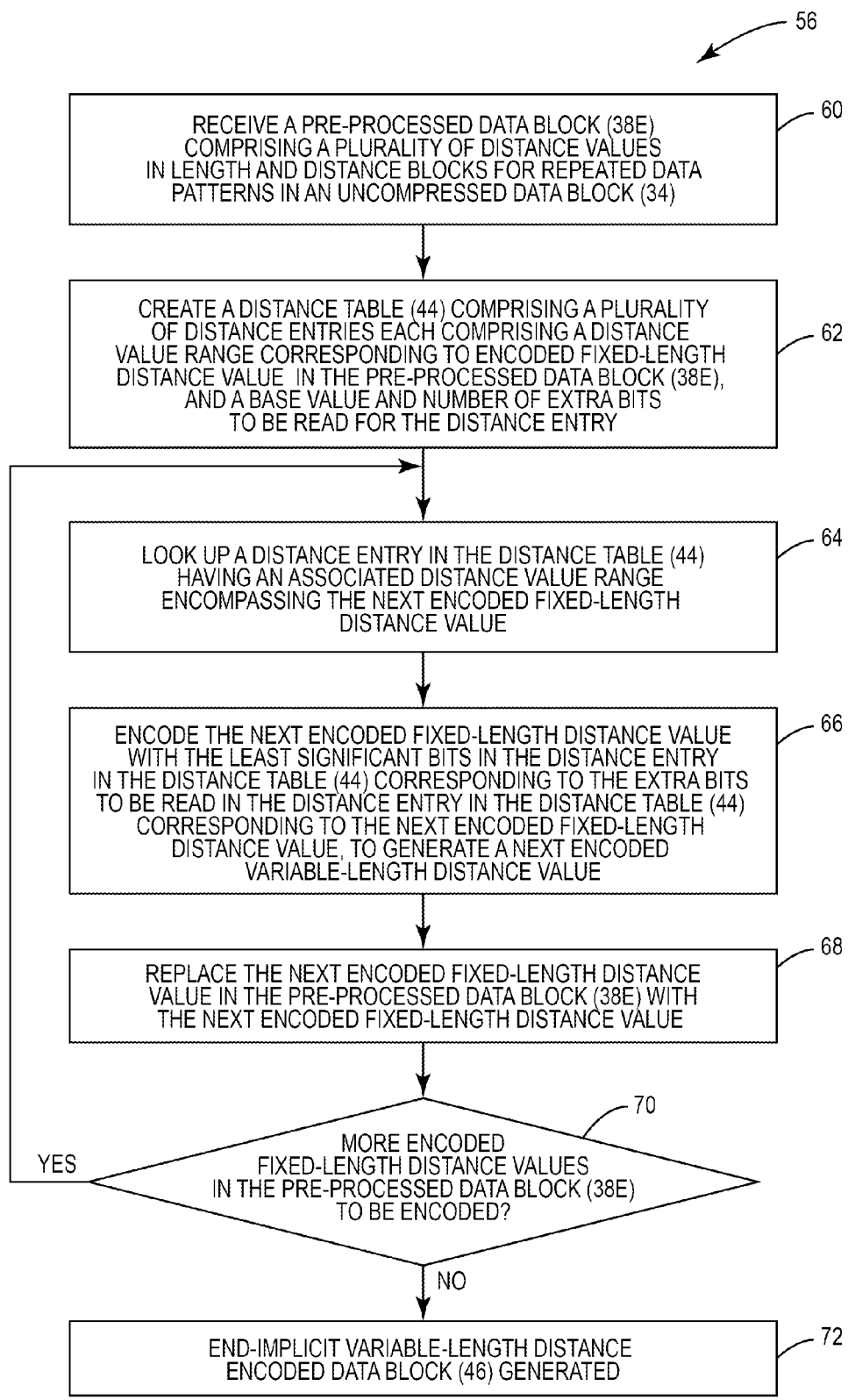
FIG. 4A is a flowchart illustrating an exemplary process of an implicit variable-length distance encoder in an implicit variable-length distance coding circuit in FIG. 3, and implicit variable-length distance encoding distance values in LZ-based length and distance blocks in a pre-processed data block during data compression.
Figure 4B:
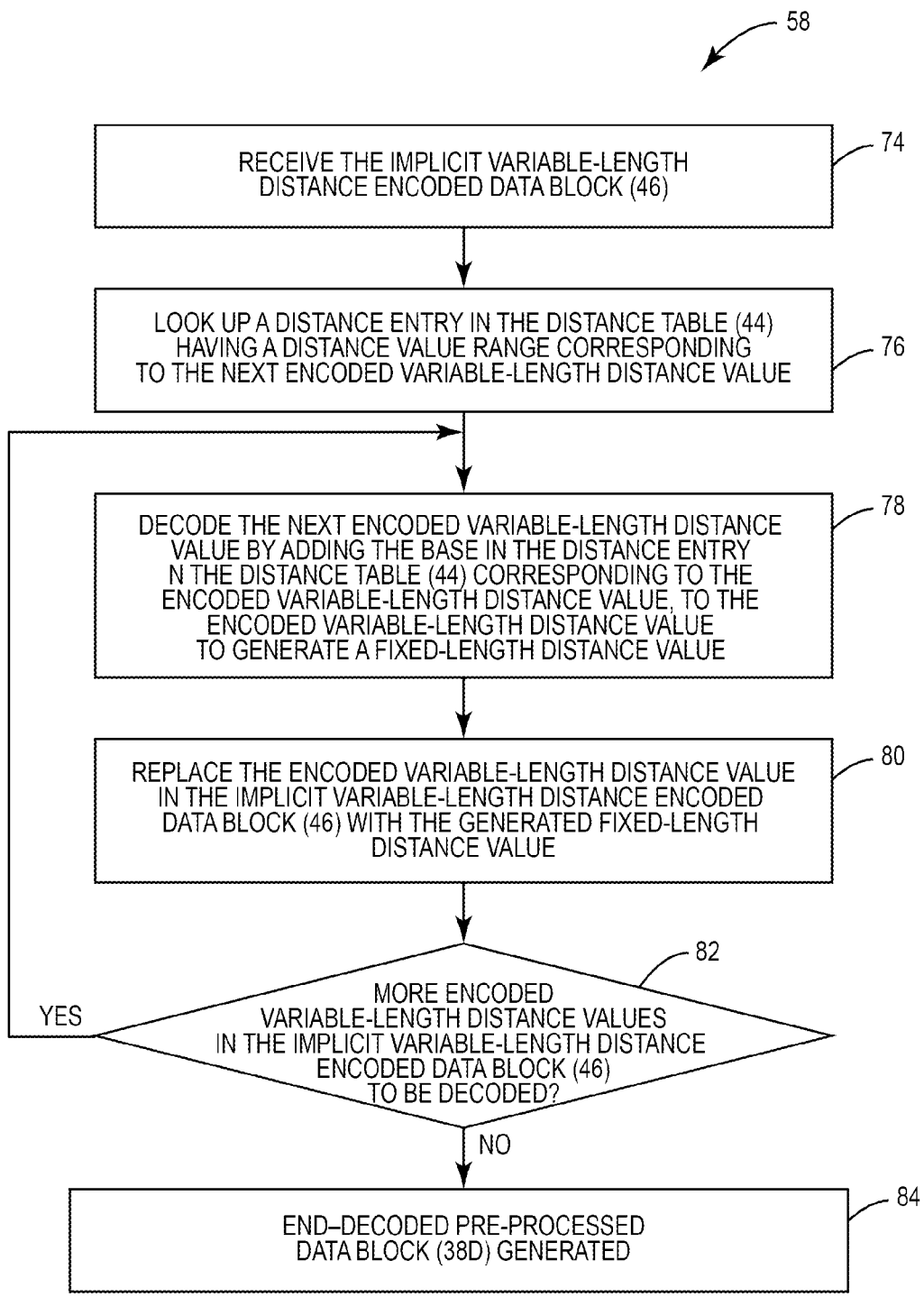
FIG. 4B is a flowchart illustrating an exemplary process of an implicit variable-length distance decoder in an implicit variable-length distance coding circuit in FIG. 3, and implicit variable-length distance decoding encoded distance values in an implicit variable-length distance encoded data block during data decompression.

More exemplary detail on implicit variable-length distance encoding of distance values in LZ-based length and distance blocks, and decoding of variable-length distance encoded distance values that can be provided by the implicit variable-length distance coding circuit 30 in FIG. 3 will now be described. In this regard, FIG. 4A is a flowchart illustrating an exemplary process 56 of the implicit variable-length distance encoder 42 in FIG. 3 implicit variable-length distance encoding distance values in LZ-based length and distance blocks in the pre-processed data block 38E during data compression. FIG. 4B is a flowchart illustrating an exemplary process 58 of the implicit variable-length distance decoder 48 in FIG. 3 implicit variable-length distance decoding encoded distance values in the implicit variable-length distance encoded data block 46 during data decompression.

In this regard, with reference to FIG. 4A, the implicit variable-length distance encoder 42 receives the pre-processed data block 38E comprising a plurality of distance values for repeated data patterns in the uncompressed data block 34 (block 60). Next, the implicit variable-length distance encoder 42 creates the distance table 44 for the pre-processed data block 38E to be used in encoding the pre-processed data block 38E with variable-length distance values (block 62). As previously discussed with regard to FIG. 2 above, the distance table 44 contains a plurality of distance entries each corresponding to a distance value range in the range of the encoded fixed-length distance values contained in the length and distance blocks of the pre-processed data block 38E. A base and number of extra bits to be read is also associated with each distance entry in the distance table 44. As previously discussed, the distance table 44 is employed to encode the encoded fixed-length distance values in the length and distance blocks of the pre-processed data block 38E into encoded variable-length distance values based on the implicit coding of the base and the significant bits in the distance value corresponding to the extra bits to be read. As previously discussed above with regard to FIG. 2, the base and number of extra bits to be read associated with each distance entry is based on the maximum distance value contained in the length and distance blocks of the pre-processed data block 38E as well as the distance width of the distance value range associated with the distance entry. More detail on how the different distance widths of the distance entries in the distance table 44 is discussed in more detail below with regard to FIGS. 6-7D.

With continuing reference to FIG. 4A, after the distance table 44 is created, the implicit variable-length distance encoder 42 consults the distance table 44 to encode the encoded fixed-length distance values in the length and distance blocks in the encoded pre-processed data 38E as encoded variable-length distance values. In this regard, for each encoded fixed-length distance value contained in the length and distance blocks in the pre-processed data block 38E, the implicit variable-length distance encoder 42 looks up the next distance entry to be encoded in the distance table 44 having an associated distance value range encompassing the next encoded fixed-length distance value (block 64). The implicit variable-length distance encoder 42 uses the number of bits to be read, in the distance entry of the distance table 44 corresponding to the next encoded fixed-length distance value, to encode the next encoded fixed-length distance value as an encoded variable-length distance value (block 66). The number of bits to be read value is used to determine the number of least significant bits of the distance value to encode as the encoded variable-length distance value. The implicit variable-length distance encoder 42 then replaces the encoded fixed-length distance value in the pre-processed data block 38E with the encoded variable-length distance value (block 68). The implicit variable-length distance encoder 42 determines if there are any more encoded fixed-length distance values in the length and distance blocks in the pre-processed data block 38E to be encoded (block 70). If there are more fixed-length distance values in the length and distance blocks in the pre-processed data block 38E to be encoded, the implicit variable-length distance encoder 42 repeats the steps in blocks 64-68 described above until the desired, or all, encoded fixed-length distance values in the length and distance blocks in the pre-processed data block 38E are encoded, resulting in the implicit variable-length distance encoded data block 46 (block 72).

The implicit variable-length distance encoded data block 46 can be decompressed at a later time when the data in the implicit variable-length distance encoded data block 46 is desired to be accessed for any reason. In this regard, as discussed above, FIG. 4B is a flowchart illustrating the exemplary process 58 of the implicit variable-length distance decoder 48 in FIG. 3 implicit variable-length distance decoding encoded distance values in implicit variable-length distance encoded data block 46 during data decompression. In this regard, the implicit variable-length distance decoder 48 receives the implicit variable-length distance encoded data block 46 (block 74). For each encoded variable-length distance value in the implicit variable-length distance encoded data block 46, the implicit variable-length distance decoder 48 then looks up the distance entry in the distance table 44 having a distance value range corresponding to the next encoded variable-length distance value to be decoded (block 76). The implicit variable-length distance decoder 48 then decodes the next encoded variable-length distance value by adding the base in the distance entry in the distance table 44 corresponding to the next encoded variable-length distance value, to the next encoded variable-length distance value (i.e., the offset from the base) to generate a fixed-length distance value (block 78). The implicit variable-length distance decoder 48 then replaces the encoded variable-length distance value in the implicit variable-length distance encoded data block 64 with the generated fixed-length distance value (block 80). If there are any more encoded variable-length distance values in the length and distance blocks in the implicit variable-length distance encoded data block 46 to be decoded (block 82), the implicit variable-length distance decoder 48 repeats the steps in blocks 76-80 described above until the desired or all encoded variable-length distance values in the implicit variable-length distance encoded data block 46 are decoded, resulting in the decoded pre-processed data block 38D (block 84).

As discussed above with regard to FIGS. 3 and 4A, as part of further encoding the distance values in the length and distance blocks in the pre-processed data block 38E, the distance table 44 is created. The distance table 44 can be created with customized distance entries that span different distance value ranges over the entire distance value range of distance values contained in the pre-processed data block 38E to provide efficient variable-length distances for further data compression. There are tradeoffs in selecting distance value ranges for distance entries created in the distance table 44. Providing too many distance entries in a distance table 44 may cause the distance table 44 to consume more memory than desired. Providing too few distance entries in a distance table 44 may not allow for encoding variable-length distances in fewer overall bits than fixed-length distances in a pre-processed data block 38E. Further, the frequency of different distance values in a pre-processed data block 38E affects the ability to accomplish further data compression, because distance values may occur more frequently in the pre-processed data block 38E in certain distance value ranges than others. For example, distance entries spanning a smaller distance value range may allow for fewer offset bits (i.e., extra bits to be read) to encode a fixed-length distance value than a larger distance value range. Thus, it may be desired to provide distance entries in a distance table 44 used for implicit variable-length distance coding that are unevenly distributed over the distance value range of a pre-processed data block 38E to allow for smaller bit size encoding of distance values that occur more frequently in pre-processed data blocks 38E.

Figure 5:
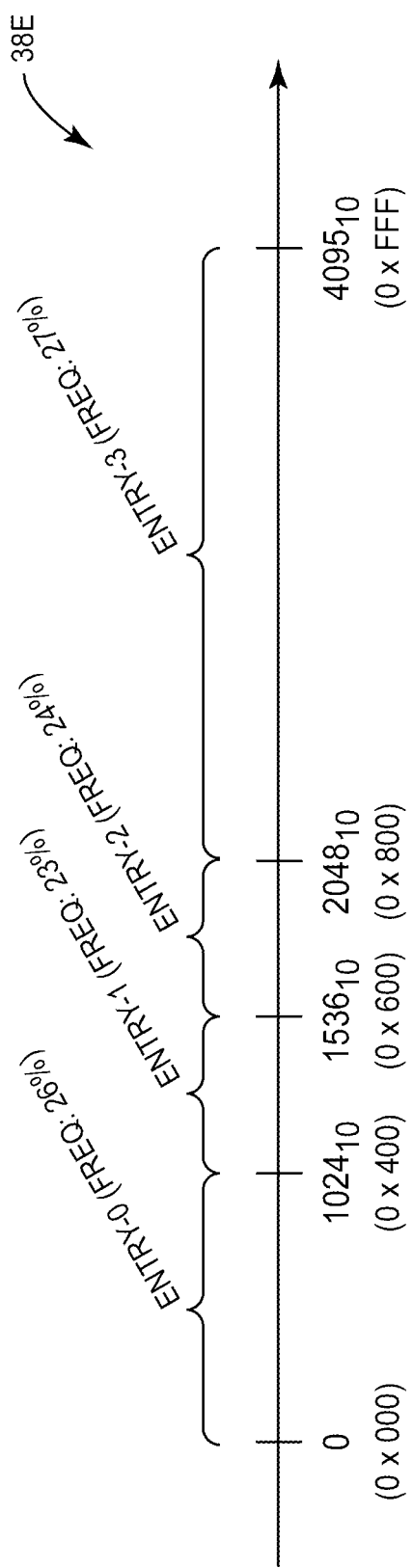
FIG. 5 illustrates a maximum distance value range of distances in LZ-based length and distance blocks divided into uneven distributions of distance value ranges based on determined frequencies of distances in encoded LZ-based length and distance blocks in LZ-based compressed data.

In this regard, FIG. 5 illustrates exemplary distance entries covering distance value ranges for distance values in LZ-based length and distance blocks in a pre-processed data block 38E according to the exemplary distance table 18 in FIG. 2 previously described above. As shown therein, the distance entries Entry-0-Entry-3 are distributed unevenly over different distance value ranges of the distance values in the encoded LZ-based length and distance blocks to account for the uneven frequency distribution of distance values over the entire distance value range. The maximum distance value in the pre-processed data block 38E shown in FIG. 5 is $4096_{10}$. There are four (4) distance entries: Entry-0-Entry 3. Entry-0 spans the distance value range of $0-1023_{10}$, which covers a 26% frequency distribution of distance values over the pre-processed data block 38E. By Entry-0 spanning the distance value range of $0-1023_m$, Entry-0 covers an even distance value range of 1024 distance values of the pre-processed data block 38E (i.e., $4096_{10}/4$ distance entries=1024 distance values in covered range). This means that the distance values in a pre-processed data block 38E within the distance value range of Entry-0 (i.e., $0-1023_{10}$) can be encoded with a ten ($10_{10}$) bit offset (i.e., $2^{10}=1024_{10}$) as also shown in FIG. 2, as opposed to twelve ($12_{10}$) bits (i.e., $2^{12}=4096$).

With continuing reference to FIG. 5, Entry-1 and Entry-2 span uneven distance value ranges from Entry-0. Entry-1 spans the distance value range of $1024_{10}-1535_{10}$ and covers a 23% frequency distribution of distance values in the pre-processed data block 38E. Entry-2 spans the distance value range of $1536_{10}-2047_{10}$ and covers a 24% frequency distribution of distance values in the pre-processed data block 38E. Thus, 47% of the distance values in the pre-processed data block 38E within the distance value ranges of Entry-1 and Entry-2 (i.e., 23%+24% distribution frequencies) can be encoded with a nine ($9_{10}$) bit offset, as also shown in FIG. 2. With four (4) distance entries, the last distance entry in this example, Entry-3, spans the distance value range of $2048_{10}$-$4095_{10}$ so that all distance value ranges are covered. Thus, providing distance entries in the distance table 18 with distance value ranges smaller than an even distance value range over the entire distance value range causes other distance entries to cover larger, uneven distance value ranges.

Figure 6:
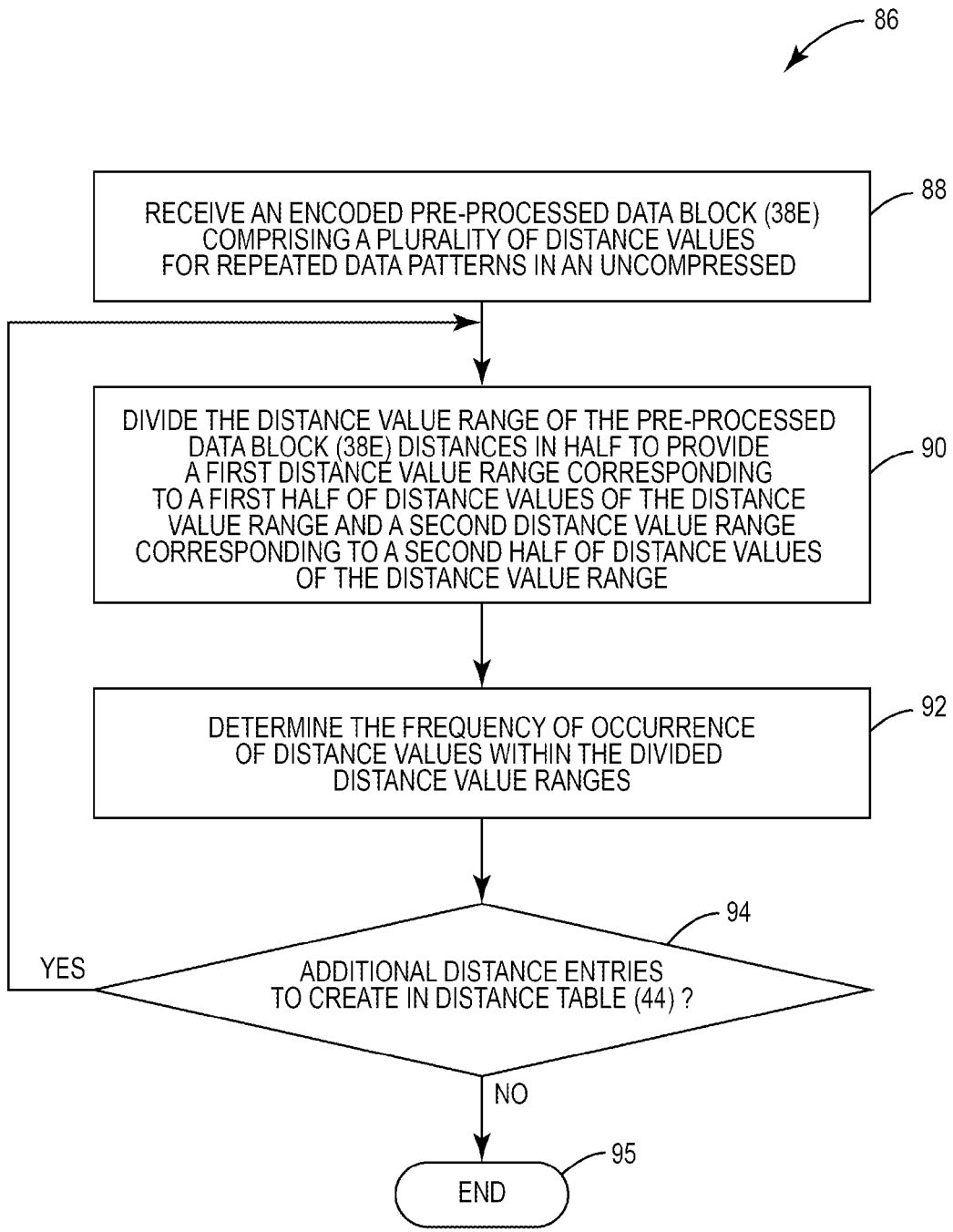
FIG. 6 is a flowchart illustrating an exemplary process of an implicit variable-length distance encoder in a data coding circuit building a distance table to be used for implicit variable-length distance encoding.

FIG. 6 is a flowchart illustrating an exemplary process 86 that can be employed to select distance entries with the desired distance value ranges based on distance frequency, to build the distance table 44 in the implicit variable-length distance coding circuit 30 in FIG. 3. The process 86 of building a distance table 44 in FIG. 6 can be employed in step 62 of FIG. 4A discussed above as part of the implicit variable-length distance coding circuit 32 building the distance table 44 based on a received pre-processed data block 38E before implicit variable-length distance encoding of the pre-processed data block 38E to generate the implicit variable-length distance data block 46. FIGS. 7A-7D illustrate exemplary iterative steps performed by the exemplary process 86 in FIG. 6 to determine the distance entries to be included in the distance table 44 according to the exemplary distance entries illustrated in FIG. 5. In this regard, FIGS. 6 and 7A-7D will be discussed together as an example.

Figure 7A:
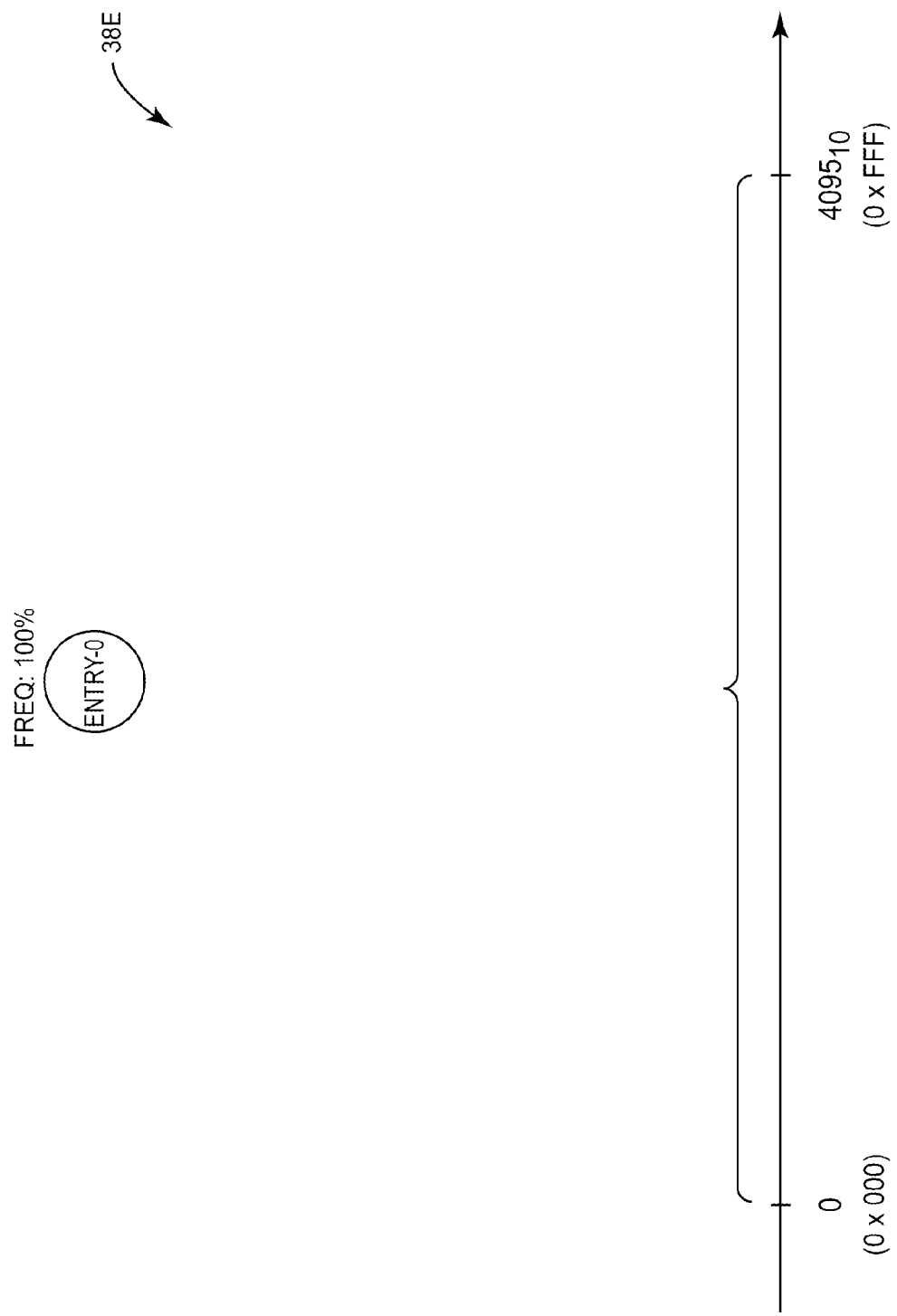
FIGS. 7A-7D illustrate exemplary iterative steps performed by the exemplary process in FIG. 6 to divide distance value ranges based on determined frequencies of distances in encoded LZ-based length and distance blocks in LZ-based compressed data.
Figure 7B:
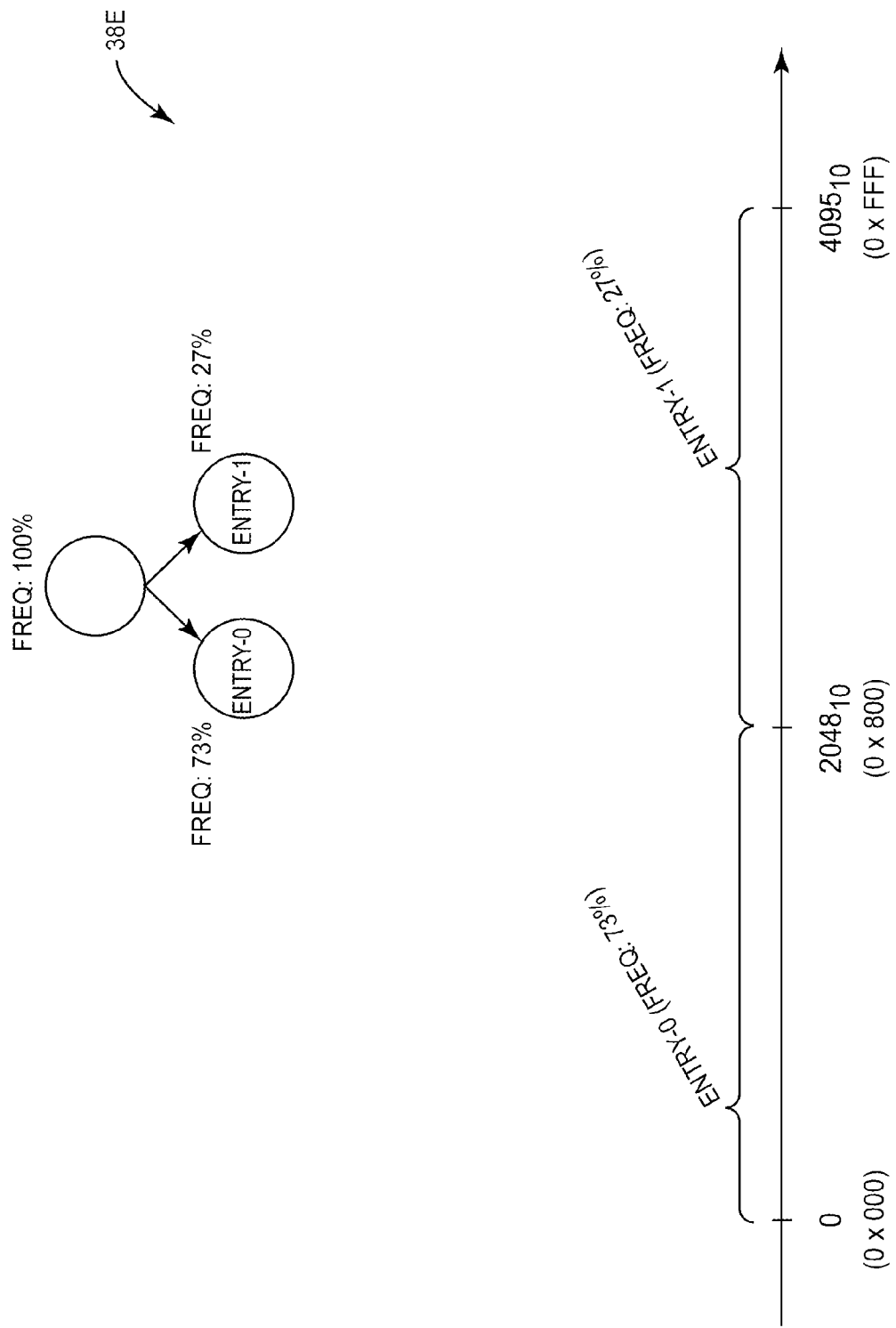

With reference to FIG. 6, for the implicit variable-length distance coding circuit 32 in FIG. 3 to build the distance table 44 in this example, the implicit variable-length distance encoder 42 receives the pre-processed data block 38E (block 88). As previously discussed, the pre-processed data block 38E comprises a plurality of distance values for repeated data patterns in an uncompressed data block 34. For example, the pre-processed data block 38E may be as illustrated in FIG. 7A, where the distance value range of distance values spans 0-$4905_{10}$. Thus, the distance value range of 0-$4905_{10}$ includes 100% of the possible distance values in the pre-processed data block 38E.

Next, with continuing reference to FIG. 6, the implicit variable-length distance encoder 42 divides the entire distance value range of the pre-processed data block 38E in half to provide a first distance value range corresponding to a first half of distance values of the entire distance value range and a second distance value range corresponding to a second half of distance values of the entire distance value range (block 90). This is shown by example in FIG. 7B, wherein distance Entry-0 comprises the first distance value range of 0-$2047_{10}$ and distance Entry-1 comprises the second distance value range of $2048_{10}$-$4095_{10}$ in the example of the pre-processed data block 38E in FIG. 5. If the entire distance value range of the pre-processed data block 38E is not a power of two (2), then in one example, the maximum distance value could be extended to the next power of two (2). This is so that dividing the entire distance value range in half provides divided first and second distance value ranges that are also powers of two (2). Providing distance value ranges in distances entries that are powers of two (2) allows the same number of bits to be used as the offset in the implicit variable-length distance coding for any distance value within the range of the distance entry. For example, if the maximum distance value in the pre-processed data block 38E were 6047, with the next power of two (2) being $8192_{10}$ (i.e., $2^{13}$), the divided first and second distance value ranges would be 0-$4095_{10}$ and $4096_{10}$-$8191_{10}$.

With continuing reference to FIG. 6, after the entire distance value range of 0-$4095_{10}$ is divided in half, the implicit variable-length distance encoder 42 determines the frequency of occurrence of distance values that appears in each of the divided first and second distance value ranges (block 92). This is so that if it is desired to further create additional distance entries in the distance table 44, the additional distance entries can be created from among the first and second distance value ranges that have the greater frequency of occurrence of distance values contained with their respective distance value range. In this manner, the distance entries are narrowed in distance value ranges of distance values that more often appear in the pre-processed data block 38E, so that the number of offset bits required to variable-length encode the distance values may be less and greater data compression may be achieved as a result. For example, as illustrated in the example of the pre-processed data block 38E in FIG. 7B, distance Entry-0 covering the first distance value range of 0-$2047_{10}$ was determined to contain 73% of the distance values in the pre-processed data block 38E. Distance Entry-1 covering the second distance value range of $2048_{10}$-$4095_{10}$ was determined to contain 27% of the distance values in the pre-processed data block 38E. Thus, it may be desired to further divide the first distance value range in distance Entry-0 to create additional distance entries for the distance table 44 if it is desired to create additional distance entries in the distance table 44 (block 94) until the desired number of distance entries are created, in which the process ends (block 95).

Figure 7C:
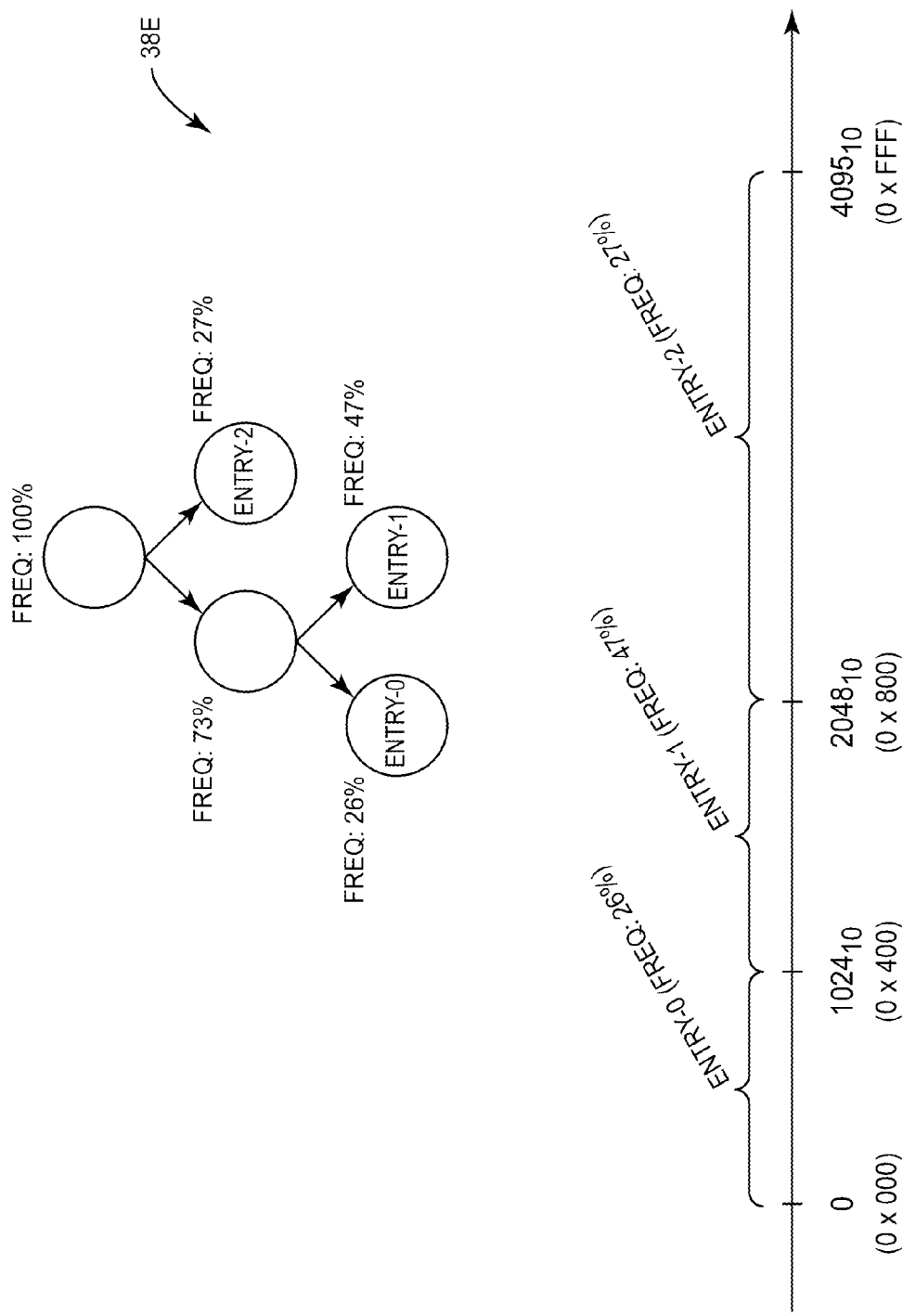
Figure 7D:
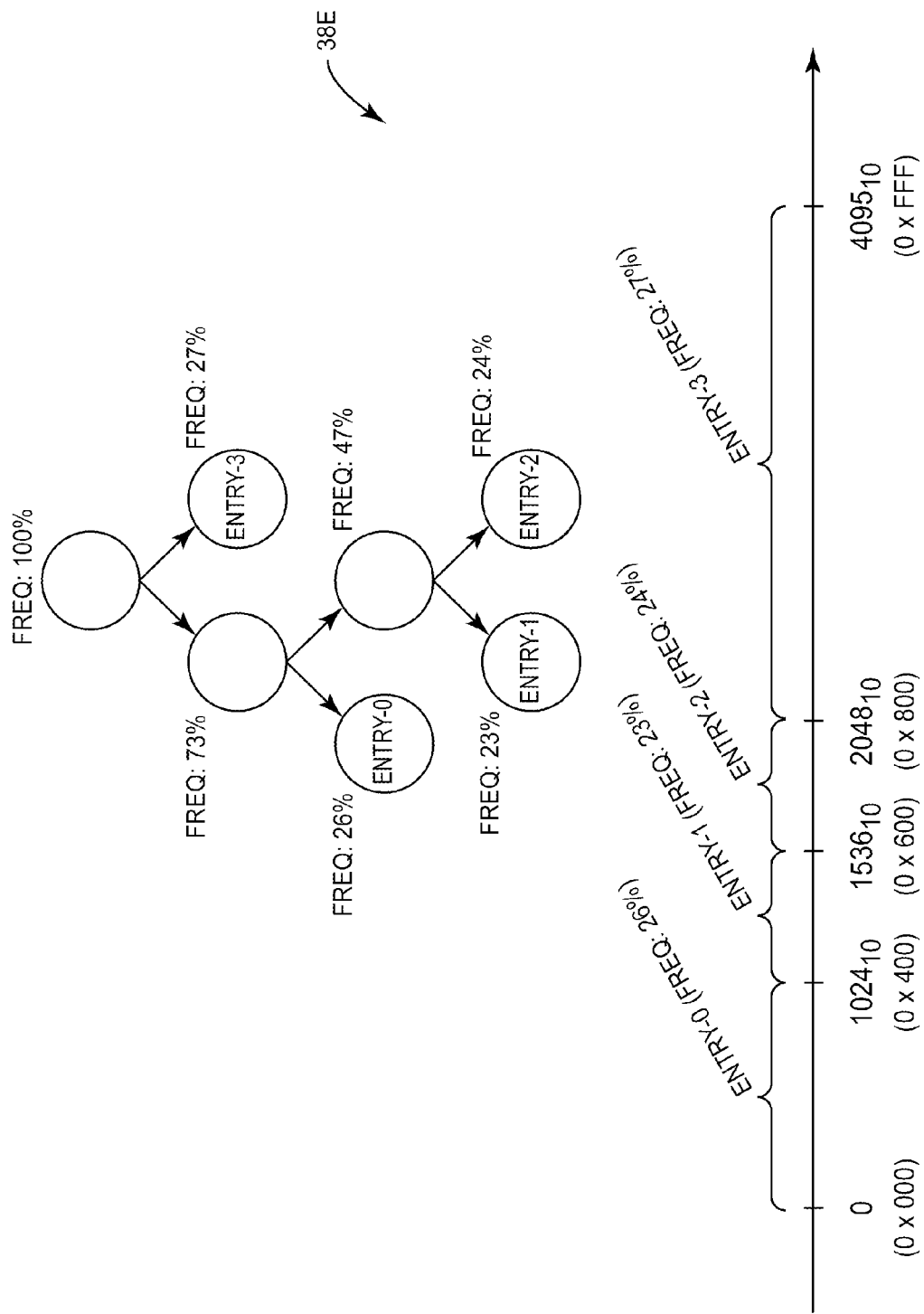

In this regard, the process 86 in FIG. 6 repeats by returning to the step in block 90. As illustrated in the example pre-processed data block 38E in FIG. 7C, the distance Entry-0 covering the first distance value range is further divided in half to provide the distance Entry-0 as covering distance value range 0-$1023_{10}$ and distance Entry-1 as covering distance value range $1024_{10}$-$2047_{10}$. Distance Entry-2 becomes the second distance value range covering $2048_{10}$-$4095_{10}$. In this manner, the number of offset bits required to variable-length encode distance values falling in the distance value ranges of distance Entry-0 and Entry-1 is ten (10) bits, whereas the number of offset bits required to variable-length encode distance values falling in the distance value ranges of distance Entry-2 is eleven (11) bits. But, distance Entry-0 and Entry-1 cover 73% of the distance values contained in the pre-processed data block 38E in this example. Again, with reference back to FIG. 6, the implicit variable-length distance encoder 42 again determines the frequency of occurrence of distance values appearing in each of the further divided distance value ranges in distance Entry-0 and Entry-1 (block 92), which is 26% and 47%, respectively in this example, as illustrated in FIG. 7C. Thus, if it is desired to create an additional distance entry in the distance table 44 (block 94 in FIG. 6), distance Entry-1 having the greater distance value frequency of 47% over distance value range $1024_{10}$-$2047_{10}$ can be divided again as distance Entry-1 covering a distance value range of $1024_{10}$-$1535_{10}$ and distance Entry-2 covering a distance value range of $1536_{10}$-$2047_{10}$, both of which only need nine ($9_{10}$) bits for their offset, as also previously discussed above in FIG. 2. This is illustrated in FIG. 7D, which includes the final distance entry division in this example as provided in FIG. 5. Previous distance Entry-2, covering a distance value range of $2048_{10}$-$4095_{10}$, becomes distance Entry-3, as also shown in FIG. 7D.

In the example of the distance entries in FIGS. 5 and 7A-7D, the distance entries did not overlap distance values. Each distance entry, Entry-0-Entry-3, covered a unique range of distance values. However, this is not required. For example, it may be desired to provide for distance entries that cover an even smaller range of distance values than provided in FIG. 5 for distance values that appear frequently in the pre-processed data block 38E. A particular single distance value could even have its own dedicated distance entry in the distance table 44, which would not need an offset since the distance entry base for a single distance value would actually represent the single distance value without need for an offset. Further, a large number of distances values in the pre-processed data block 38E may have the same common multiple. For example, software instructions may commonly be four (4) bytes long. Thus, for repetitions of these software instructions, distance values equal to four (4) may commonly appear in the pre-processed data block 38E as a result. Thus, if a distance entry in a distance table 44 can be associated with a multiple, a distance value falling in the range of the distance entry and being a multiple of the associated multiple with the distance entry could be implicitly encoded in a variable-length distance of less offset bits.

In this regard, FIG. 8 is another exemplary distance table 44(1) that can be generated by the implicit variable-length distance encoder 42 of the implicit variable-length distance coding circuit 30 in FIG. 3. The distance table 44(1) in FIG. 8 includes distance entries defined by both a defined distance value range and a multiple, as opposed to only a distance value range. Distance Entry-1, Entry-2, and Entry 3 cover the entire range of distance values of $0$-$4095_{10}$ in this example, but only if the distance value is a multiple of four ($4_{10}$), as indicated in a multiples column 96 in the distance table 44(1). This allows for the extra bits to be read for these distance entries to be two ($2_{10}$) less bits than otherwise, because these distance entries are used to encode and decode distance values that are known to be multiples of four ($4_{10}$). For example, if a distance value in the pre-processed data block 38E was $1540_{10}$, thus covered by distance Entry-2, this distance value could be encoded as eight ($8_{10}$) bits instead of ten ($10_{10}$) bits. This is because the least two (2) significant bits of the distance value are implicitly coded in Entry-2 as "$00_2$." Thus, distance value $1540_{10}$, which is $604_{16}$, could be encoded with an eight ($8_{10}$) bits offset of "$10000001_2$" as eight (8) bits instead of a ten ($10_{10}$) bit offset of "$1000000100_2$." In this example, because distance Entry-1, Entry-2, and Entry-3 span the entire distance value range of the pre-processed data block 38E, but only for distance values that are multiples of four ($4_{10}$), and the distance table 44(1) in this example is limited to four ($4_{10}$) distance entries, distance Entry-0 is provided as a "catch-all" for all other distance values that are not multiples of ($4_{10}$). While an encoded variable-length distance bit size reduction will not result over a fixed-length distance bit size for distance values covered by Entry-0 in the distance table 44(1), distance values will not go encoded. This is a trade-off in this example for providing the ability to achieve further reduced variable-length encoding of distance values as multiples in this example.

The LZ-based data compression employing implicit variable-length distance coding according to aspects disclosed herein may be provided in or integrated into any processor-based device to provide data compression. Examples, without limitation, include a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

Figure 9:
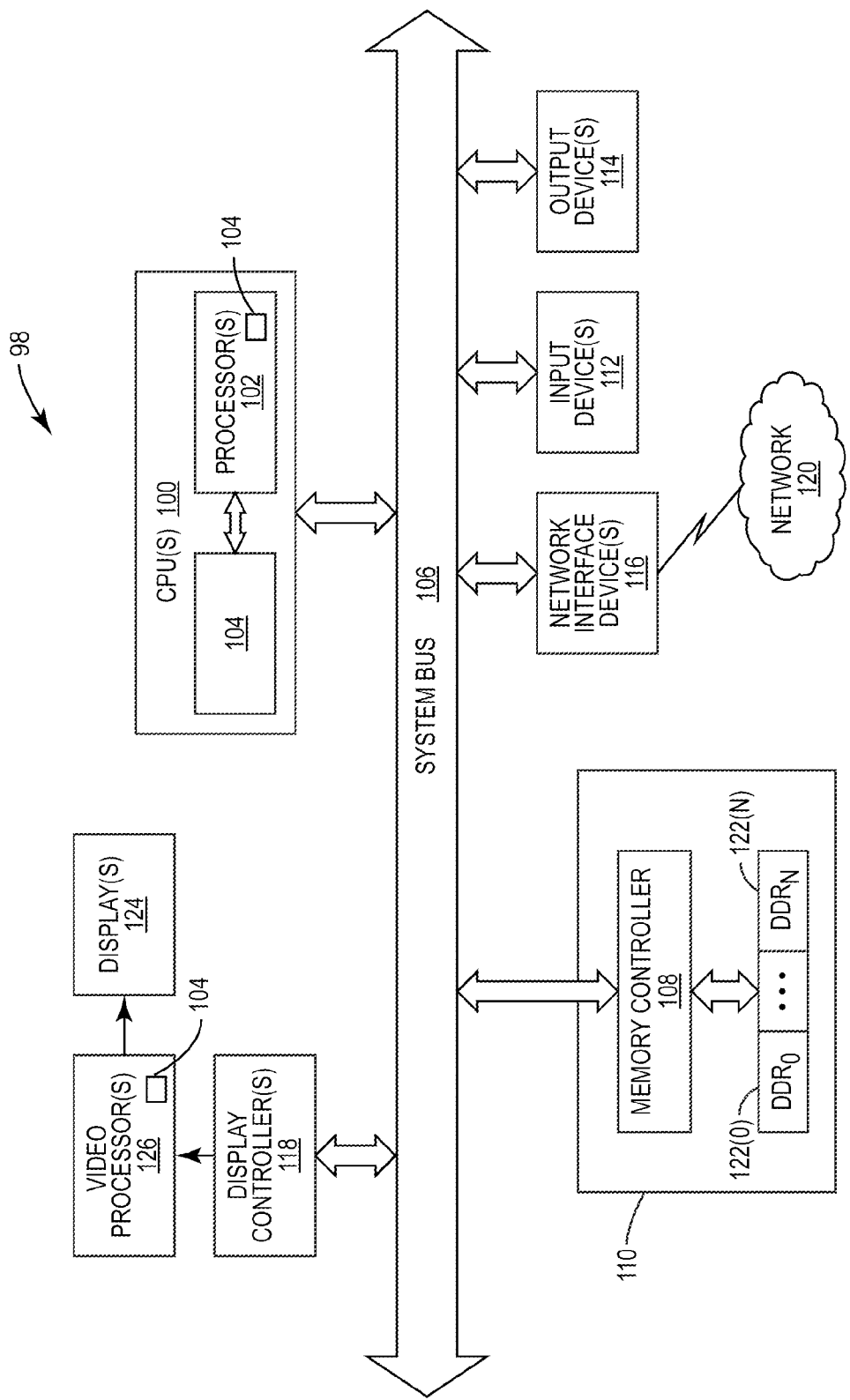
FIG. 9 is a block diagram of an exemplary processor-based system that can include circuits employing implicit variable-length distance coding of distances in encoded LZ-based length and distance blocks in compressed data to further reduce distance bit lengths.

In this regard, FIG. 9 illustrates an example of a processor-based system 98 that can employ implicit variable-length distance coding circuit 104 according to any of the aspects disclosed herein, including but not limited to the implicit variable-length distance coding circuit 30, in FIG. 3. As illustrated in FIG. 10, the implicit variable-length distance coding circuit 104 can be provided in different processing units or controllers that involve data transfer and may involve compression and/or decompression of data. In this example in FIG. 10, the processor-based system 98 includes one or more central processing units (CPUs) 100, each including one or more processors 102. The CPU(s) 100 may have cache memory 104 coupled to the processor(s) 102 for rapid access to temporarily stored data. The CPU(s) 100 is coupled to a system bus 106 and can intercouple master and slave devices included in the processor-based system 98. As is well known, the CPU(s) 100 communicates with these other devices by exchanging address, control, and data information over the system bus 106. For example, the CPU(s) 100 can communicate bus transaction requests to a memory controller 108 as an example of a slave device. Although not illustrated in FIG. 9, multiple system buses 106 could be provided, wherein each system bus 106 constitutes a different fabric.

Other master and slave devices can be connected to the system bus 106. As illustrated in FIG. 9, these devices can include a memory system 110, one or more input devices 112, one or more output devices 114, one or more network interface devices 116, and one or more display controllers 118, as examples. The input device(s) 112 can include any type of input device, including but not limited to input keys, switches, voice processors, etc. The output device(s) 114 can include any type of output device, including but not limited to audio, video, other visual indicators, etc. The network interface device(s) 116 can be any devices configured to allow exchange of data to and from a network 120. The network 120 can be any type of network, including but not limited to a wired or wireless network, a private or public network, a local area network (LAN), a wide local area network (WLAN), and the Internet. The network interface device(s) 116 can be configured to support any type of communications protocol desired. The memory system 110 can include one or more memory units 122(0-N).

The CPU(s) 100 may also be configured to access the display controller(s) 118 over the system bus 106 to control information sent to one or more displays 124. The display controller(s) 118 sends information to the display(s) 124 to be displayed via one or more video processors 126, which process the information to be displayed into a format suitable for the display(s) 124. The display(s) 124 can include any type of display, including but not limited to a cathode ray tube (CRT), a liquid crystal display (LCD), a plasma display, etc.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master devices, and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An implicit variable-length distance coding circuit, comprising:
   an implicit variable-length distance encoder configured to:
      receive a pre-processed data block comprising a plurality of distance values for repeated data patterns in an uncompressed data block; and
      generate an implicit variable-length distance encoded data block of the pre-processed data block by, for each distance value of the plurality of distance values in the pre-processed data block, being configured to:
         lookup a distance entry among a plurality of distance entries in a distance table comprising a distance value range corresponding to the distance value, the distance entry comprising a base value corresponding to the distance value range and a number of extra bits to be read corresponding to the distance value range; and
         encode the distance value with least significant bits of the number of extra bits in the distance value corresponding to the number of extra bits to be read in the distance entry in the distance table corresponding to the distance value, to generate an encoded distance value.

2. The implicit variable-length distance coding circuit of claim 1, wherein the implicit variable-length distance encoder is further configured to generate the implicit variable-length distance encoded data block by,
   for each of the plurality of distance values in the pre-processed data block, being configured to replace the distance value in the pre-processed data block with the encoded distance value.

3. The implicit variable-length distance coding circuit of claim 1, further comprising:
   an implicit variable-length distance decoder configured to:
      receive the implicit variable-length distance encoded data block; and
      generate the pre-processed data block from the implicit variable-length distance encoded data block, by, for each of the plurality of encoded distance values in the implicit variable-length distance encoded data block, being configured to:
         lookup a distance entry in the distance table comprising a distance value range corresponding to the encoded distance value; and
         decode the encoded distance value by adding the base value in the distance entry corresponding to the encoded distance value, to the encoded distance value to generate the distance value.

4. The implicit variable-length distance coding circuit of claim 3, wherein the implicit variable-length distance decoder is further configured to generate the pre-processed data block by,
   for each of the plurality of encoded distance values in the implicit variable-length distance encoded data block, being configured to replace the encoded distance value in the implicit variable-length distance encoded data block with the generated distance value.

5. The implicit variable-length distance coding circuit of claim 3, wherein the implicit variable-length distance decoder is configured to lookup the distance entry in the distance table by being further configured to lookup the distance entry in the distance table comprising the distance value range corresponding to the distance value and the distance value being a multiple of a multiples indicator of the distance entry.

6. The implicit variable-length distance coding circuit of claim 1, wherein the distance table comprises a plurality of distance entries each corresponding to the distance value range within a maximum distance value range among the plurality of distance values in the pre-processed data block.

7. The implicit variable-length distance coding circuit of claim 6, wherein each distance value range for the plurality of distance entries corresponds to an even distance value range within the maximum distance value range.

8. The implicit variable-length distance coding circuit of claim 6, wherein at least one distance value range of at least one distance entry among the plurality of distance entries corresponds to an uneven distance value range within the maximum distance value range from at least one other distance entry among the plurality of distance entries.

9. The implicit variable-length distance coding circuit of claim 6, wherein each distance entry among the plurality of distance entries further comprises a multiples indicator corresponding to a multiples distance value in the distance value range corresponding to each distance entry.

10. The implicit variable-length distance coding circuit of claim 6, wherein at least one distance value range of at least one distance entry among the plurality of distance entries corresponds to the maximum distance value range.

11. The implicit variable-length distance coding circuit of claim 1, wherein the implicit variable-length distance encoder is further configured to generate the distance table by being configured to determine the plurality of distance value ranges for the plurality of distance entries based on the plurality of distance values in the pre-processed data block.

12. The implicit variable-length distance coding circuit of claim 11, wherein the implicit variable-length distance encoder is configured to determine the plurality of distance value ranges for the plurality of distance entries by being configured to:
  (a) divide a maximum distance value range for the plurality of distance values in half to provide a first distance value range corresponding to a first half of the maximum distance value range and a second distance value range corresponding to a second half of the maximum distance value range; and
  (b) determine a frequency of occurrence of the plurality of distance values within the first distance value range and the second distance value range.

13. The implicit variable-length distance coding circuit of claim 12, wherein the implicit variable-length distance encoder is further configured to determine the plurality of distance value ranges for the plurality of distance entries by being further configured to:
  (c) further divide the first distance value range and the second distance value range in which the frequency of occurrence of the plurality of distance values therein is greater.

14. The implicit variable-length distance coding circuit of claim 13, wherein the implicit variable-length distance encoder is further configured to iteratively perform steps (b) and (c) to provide the plurality of distance entries in the distance table.

15. The implicit variable-length distance coding circuit of claim 1, further comprising a Lempel-Ziv (LZ)-based encoder configured to:
  receive the uncompressed data block; and
  encode the plurality of distance values for the repeated data patterns in the uncompressed data block as a plurality of LZ-encoded length and distance blocks in the uncompressed data block to generate the pre-processed data block.

16. The implicit variable-length distance coding circuit of claim 15, further comprising an LZ-based decoder configured to:
  receive the implicit variable-length distance encoded data block; and
  decode the plurality of LZ-encoded length and distance blocks in the implicit variable-length distance encoded data block to generate the uncompressed data block.

17. The implicit variable-length distance coding circuit of claim 1, wherein the plurality of distance values comprises a plurality of unencoded distance values.

18. The implicit variable-length distance coding circuit of claim 1 integrated into an integrated circuit (IC).

19. The implicit variable-length distance coding circuit of claim 1 integrated into a device selected from the group consisting of a set top box, an entertainment unit, a navigation device, a communications device, a fixed location data unit, a mobile location data unit, a mobile phone, a cellular phone, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, and a portable digital video player.

20. An implicit variable-length distance coding circuit, comprising:
  a means for receiving a pre-processed data block comprising a plurality of distance values for repeated data patterns in an uncompressed data block; and
  a means for generating an implicit variable-length distance encoded data block of the pre-processed data block for each distance value of the plurality of distance values in the pre-processed data block, comprising:
    a means for looking up a distance entry among a plurality of distance entries in a distance table comprising a distance value range corresponding to the distance value, the distance entry comprising a base value corresponding to the distance value range and a number of extra bits to be read corresponding to the distance value range; and
    a means for encoding the distance value with least significant bits of the number of extra bits in the distance value corresponding to the number of extra bits to be read in the distance entry in the distance table corresponding to the distance value, to generate an encoded distance value.

21. The implicit variable-length distance coding circuit of claim 20, further comprising:
  a means for receiving the implicit variable-length distance encoded data block; and
  a means for generating the pre-processed data block from the implicit variable-length distance encoded data block.

22. The implicit variable-length distance coding circuit of claim 21, wherein the means for generating the pre-processed data block from the implicit variable-length distance encoded data block comprises, for each of the plurality of encoded distance values in the implicit variable-length distance encoded data block, further comprises:
  the means for looking up the distance entry in the distance table comprising the distance value range corresponding to the encoded distance value; and
  a means for decoding the encoded distance value by adding the base value in the distance entry corresponding to the encoded distance value, to the encoded distance value to generate the distance value.

23. A method for compressing data, comprising:
  receiving a pre-processed data block comprising a plurality of distance values for repeated data patterns in an uncompressed data block; and generating an implicit variable-length distance encoded data block of the pre-processed data block by, for each distance value of the plurality of distance values in the pre-processed data block:
- looking up a distance entry among a plurality of distance entries in a distance table comprising a distance value range corresponding to the distance value, the distance entry comprising a base value corresponding to the distance value range and a number of extra bits to be read corresponding to the distance value range; and
- encoding the distance value with least significant bits of the number of extra bits in the distance value corresponding to the number of extra bits to be read in the distance entry in the distance table corresponding to the distance value, to generate an encoded distance value.

24. The method of claim 23, further comprising generating the implicit variable-length distance encoded data block by, for each of the plurality of distance values in the pre-processed data block, replacing the distance value in the pre-processed data block with the encoded distance value.

25. The method of claim 23, further comprising:
receiving the implicit variable-length distance encoded data block; and
generating the pre-processed data block from the implicit variable-length distance encoded data block, by, for each of the plurality of encoded distance values in the implicit variable-length distance encoded data block:
- looking up a distance entry in the distance table comprising a distance value range corresponding to the encoded distance value; and
- decoding the encoded distance value by adding the base value in the distance entry corresponding to the encoded distance value, to the encoded distance value to generate the distance value.

26. The method of claim 25, further comprising, for each of the plurality of encoded distance values in the implicit variable-length distance encoded data block, replacing the encoded distance value in the implicit variable-length distance encoded data block with the generated distance value.

27. The method of claim 23, further comprising generating the distance table by being configured to determine a plurality of distance value ranges for a plurality of distance entries based on the plurality of distance values in the pre-processed data block.

28. A non-transitory computer-readable medium having stored thereon computer executable instructions to cause a processor-based implicit variable-length distance coding circuit to implicit variable-length distance encode data, by:

receiving a pre-processed data block comprising a plurality of distance values for repeated data patterns in an uncompressed data block; and
generating an implicit variable-length distance encoded data block of the pre-processed data block by, for each of the plurality of distance values in the pre-processed data block:
- looking up a distance entry among a plurality of distance entries in a distance table comprising a distance value range corresponding to the distance value, the distance entry comprising a base value corresponding to the distance value range and a number of extra bits to be read corresponding to the distance value range; and
- encoding the distance value with least significant bits of the number of extra bits in the distance value corresponding to the number of extra bits to be read in the distance entry in the distance table corresponding to the distance value, to generate an encoded distance value.

29. The non-transitory computer-readable medium of claim 28 having stored thereon computer executable instructions to cause the processor-based implicit variable-length distance coding circuit to implicit variable-length distance decode the implicit variable-length distance encoded data block by:
receiving the implicit variable-length distance encoded data block; and
generating the pre-processed data block from the implicit variable-length distance encoded data block, by, for each of a plurality of encoded distance values in the implicit variable-length distance encoded data block, being configured to:
- look up a distance entry in the distance table comprising a distance value range corresponding to the encoded distance value; and
- decode the encoded distance value by adding the base value in the distance entry corresponding to the encoded distance value, to the encoded distance value to generate the distance value.

30. The non-transitory computer-readable medium of claim 29 having stored thereon computer executable instructions to further cause the processor-based implicit variable-length distance coding circuit to generate the pre-processed data block to replace the encoded distance value in the implicit variable-length distance encoded data block with the generated distance value.

* * * * *